(12) United States Patent
Buynoski

(10) Patent No.: US 6,190,985 B1
(45) Date of Patent: Feb. 20, 2001

(54) PRACTICAL WAY TO REMOVE HEAT FROM SOI DEVICES

(75) Inventor: Matthew Buynoski, Palo Alto, CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/375,588

(22) Filed: Aug. 17, 1999

(51) Int. Cl.$^7$ .............. H01L 21/331; H01L 21/8222
(52) U.S. Cl. ........................... 438/311; 438/149
(58) Field of Search .................. 438/149, 311, 438/405

(56) References Cited

U.S. PATENT DOCUMENTS

| | | | |
|---|---|---|---|
| 5,006,913 | * 4/1991 | Sugahara et al. | 357/41 |
| 5,102,821 | * 4/1992 | Moleshi et al. | 437/62 |
| 5,387,555 | 2/1995 | Linn et al. . | |
| 5,504,376 | * 4/1996 | Sugahara et al. | 257/768 |
| 5,569,620 | 10/1996 | Linn et al. . | |
| 5,569,621 | * 10/1996 | Yallup et al. | 437/62 |
| 5,895,953 | * 4/1999 | Beasom et al. | 257/751 |

* cited by examiner

Primary Examiner—Richard Elms
Assistant Examiner—Bradley K Smith
(74) Attorney, Agent, or Firm—Renner, Otto, Boisselle & Sklar LLP

(57) ABSTRACT

In one embodiment, the present invention relates to a method of forming a silicon-on-insulator substrate, involving the steps of providing a first silicon substrate; depositing a metal based layer over the first silicon substrate; forming a first insulation layer over the metal based layer to provide a first structure; providing a second structure comprising a second silicon layer and a second insulation layer; bonding the first structure and the second structure together so that the first insulation layer is adjacent the second insulation layer; removing a portion of the second silicon layer thereby providing the silicon-on-insulator substrate having a combined insulation layer having a thickness of about 100 Å to about 5,000 Å, wherein the metal based layer has a thickness that is one of less than 15% of the thickness of the combined insulation layer and greater than 50% of the thickness of the combined insulation layer. In another embodiment, the present invention relates to a silicon-on-insulator substrate containing a silicon substrate layer; a metal based layer comprising a metal silicide over the silicon substrate layer; an insulation layer over the metal based layer; a silicon device layer comprising silicon over the insulation layer; and at least one of a) at least one conductive plug through the insulation layer and the silicon device layer contacting the metal based layer, and b) at least one conductive plug through the silicon substrate layer contacting the metal based layer.

16 Claims, 2 Drawing Sheets

PRACTICAL WAY TO REMOVE HEAT FROM SOI DEVICES

TECHNICAL FIELD

The present invention generally relates to improved Silicon-on-Insulator devices. More particularly, the present invention relates to methods for removing heat from Silicon-on-Insulator devices and devices having such characteristics.

BACKGROUND ART

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are formed, for example, by implantations into the silicon layer while transistor gates are formed by forming a patterned oxide and conductor layer structure.

Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latch-up; lower voltage applications; and higher "soft error" upset immunity (i.e., the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. More specifically, the oxide insulation layer has a markedly lower thermal conductivity than the thermal conductivity of conventional bulk silicon (typically used as semiconductor substrates), which typically surrounds semiconductor devices. For example, the thermal conductivity of silicon dioxide is about 1.4 W/m° C. while the thermal conductivity of conventional bulk silicon is about 150 W/m° C. As a result, the buried oxide layer undesirably insulates thermally the device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics (from the device layer) is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

In one embodiment, the present invention relates to a method of forming an SOI substrate, involving the steps of providing a first silicon substrate; depositing a metal based layer over the first silicon substrate; forming a first insulation layer over the metal based layer to provide a first structure; providing a second structure comprising a second silicon layer and a second insulation layer; bonding the first structure and the second structure together so that the first insulation layer is adjacent the second insulation layer; removing a portion of the second silicon layer thereby providing the SOI substrate having a combined insulation layer having a thickness of about 100 Å to about 5,000 Å, wherein the metal based layer has a thickness that is one of less than 15% of the thickness of the combined insulation layer and greater than 50% of the thickness of the combined insulation layer.

In another embodiment, the present invention relates to a method of facilitating heat removal from a device layer of an SOI substrate comprising bulk silicon, an insulation layer over the bulk silicon, and a silicon device layer over the insulation layer, involving the steps of forming a metal based layer having a thickness from about 100 Å to about 4,000 Å between the bulk silicon and the insulation layer; and forming a conductive plug through at least one of the insulation layer and the silicon device layer contacting the metal based layer, and the bulk silicon contacting the metal based layer.

In yet another embodiment, the present invention relates to an SOI substrate containing a silicon substrate layer; a metal based layer comprising a metal silicide over the silicon substrate layer; an insulation layer over the metal based layer; a silicon device layer comprising silicon over the insulation layer; and at least one of a) at least one conductive plug through the insulation layer and the silicon device layer contacting the metal based layer, and b) at least one conductive plug through the silicon substrate layer contacting the metal based layer.

DISCLOSURE OF INVENTION

Figure 1:
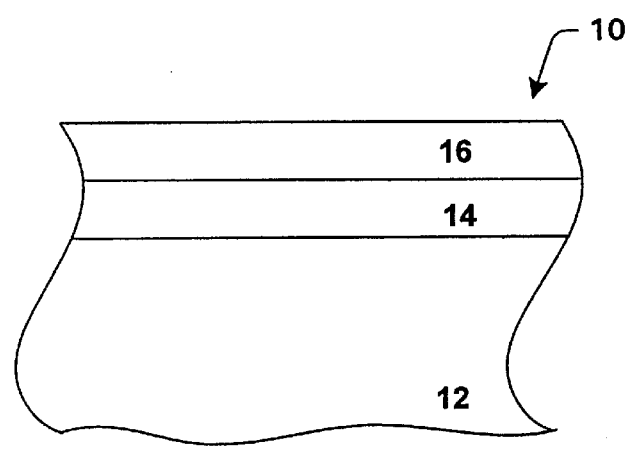
FIG. 1 is a cross-sectional view of a first structure used to make an SOI substrate according to one embodiment of the present invention.

By forming an SOI substrate having improved heat removal characteristics, the performance of devices subsequently formed on the SOI substrate can be substantially improved. While not wishing to be bound to any theory, it is believed that by forming a metal based layer according to the present invention, it is consequently possible to increase the amount of heat that may be removed (and/or increase the rate at which heat may be removed) from the device layer of the SOI substrate by spreading the heat through the metal based layer and/or conductive plugs. Improving the removal of heat from the device layer consequently improves the performance and increases the life of devices, such as MOSFETs, formed on the device layer of the SOI substrate.

The present invention involves positioning a metal based layer adjacent and below the buried insulation layer of an SOI substrate. In the completed SOI substrate, the metal based layer acts as a heat spreader. The metal based layer has relatively high thermal conductivity and thus facilitates the transfer of heat away from and/or evenly spreads (preventing local build-up of) heat generated in the device layer of the SOI substrate. Contacts or conductive plugs (thermally conductive) can be employed to further draw any heat away from the metal based layer, either up through plugs in the device layer or down into the bulk silicon layer, or both.

The metal based layer contains a metal that forms a stable metal silicide and adheres well to bulk silicon and insulator material (such as silicon dioxide). Such metals include one or more of chromium, molybdenum, platinum, tantalum, titanium, and tungsten. At least one of chromium, platinum, and titanium are preferred. The thermal conductivity of the metal based layer is relatively high compared to the thermal conductivity of the insulation layer and bulk silicon. In one embodiment, the thermal conductivity of the metal based layer is at least 100 times higher than the thermal conductivity of the insulation layer. In this connection, the metal based layer typically has a thermal conductivity of at least about 150 W/m° C., and more typically at least about 200 W/m° C. In another embodiment, the thermal conductivity of the metal based layer is at least 200 times higher than the thermal conductivity of the insulation layer.

The metal based layer can be formed to any thickness suitable for facilitating heat removal from the subsequently formed device layer. In one embodiment, generally, the thickness of the metal based layer is from about 100 Å to about 4,000 Å. In another embodiment, the thickness of the metal based layer is from about 200 Å to about 3,000 Å. In one embodiment where the thickness of the metal based layer is less than 15% the thickness of the insulation layer, the thickness of the metal based layer is from about 100 Å to about 1,000 Å. In another embodiment where the thickness of the metal based layer is less than 15% the thickness of the insulation layer, the thickness of the metal based layer is from about 150 Å to about 500 Å. In one embodiment where the thickness of the metal based layer is greater than 50% the thickness of the insulation layer, the thickness of the metal based layer is from about 1,200 Å to about 4,000 Å. In another embodiment where the thickness of the metal based layer is greater than 50% the thickness of the insulation layer, the thickness of the metal based layer is from about 1,500 Å to about 3,500 Å.

The metal based layer is formed in any suitable manner over the bulk or monocrystalline silicon layer including direct metal deposition and silicide formation. Direct metal deposition simply involves depositing a metal on bulk silicon. This is accomplished by physical vapor deposition (PVD) and particularly sputtering or chemical vapor deposition (CVD). Such methods are known in the art. After one or more metals are deposited on the silicon, an insulation layer is formed thereover using any suitable technique including CVD and wet and dry oxidation processes. This structure containing the metal based layer is then bonded to a second structure containing an insulation layer on bulk silicon (typically the same structure, but without the metal based layer). The two structures are fused at the respective insulation layers, and the bulk silicon of the second structure is etched back to a desired thickness to form an SOI substrate. During at least one of the insulation layer formation, bonding of the two structures, and the bulk silicon etch back, elevated temperatures induce the formation of a metal silicide layer in the metal based layer. That is, the metal originally deposited over the bulk silicon (if a metal is previously deposited instead of depositing a metal silicide) is converted to a metal silicide, due to its proximity to the bulk silicon during a heating step. Typically, the metal silicide layer is formed under the heat applied during bonding of the two structures. This is because silicidation commonly occurs between temperatures from about 500° C. to about 900° C.

Silicide formation involves forming a metal silicide layer over the bulk silicon. The metal silicide layer may be formed by PVD or CVD techniques. Such methods are known in the art. After the metal silicide layer is formed on the silicon, an insulation layer is formed thereover using any suitable technique including CVD and wet and dry oxidation processes. This structure containing the metal based layer is then bonded to a second structure containing an insulation layer on bulk silicon (typically the same structure, but without the metal based layer). The two structures are fused at the respective insulation layers and the bulk silicon of the second structure is etched back to a desired thickness to form an SOI substrate.

The SOI substrate formed in accordance with the present invention has a bulk or monocrystalline silicon layer, a metal based layer over the bulk silicon layer, a buried insulation layer over the metal based layer, and a silicon layer (device layer) over the buried insulation layer. The buried insulation layer typically contains silicon dioxide, although the insulation layer may contain any suitable insulating or oxide material. The buried insulation layer has thickness from about 100 Å to about 5,000 Å. In another embodiment, the buried insulation layer has thickness from about 1,000 Å to about 4,000 Å. In another embodiment, the buried insulation layer has thickness from about 2,000 Å to about 3,500 Å. The device layer has thickness from about 500 Å to about 5,000 Å. In another embodiment, the device layer has thickness from about 1,000 Å to about 3,000 Å.

In one embodiment, the metal based layer has a thickness that is one of less than 15% of the thickness of the insulation layer and greater than 50% of the thickness of the insulation layer. In another embodiment, the metal based layer has a thickness that is one of less than 10% of the thickness of the insulation layer and greater than 60% of the thickness of the insulation layer. In some instances, a relatively thin metal based layer (less than 15% of the thickness of the insulation layer) or a relatively thick metal based layer (greater than 50% of the thickness of the insulation layer) is most effective for dissipating heat.

Conductive plugs may be formed above and/or below the metal based layer in contact with the metal based layer. The conductive plugs serve to further facilitate the transfer of heat away from the device layer, and particularly away from the metal based layer. Heat removed via the conductive plugs is dissipated in the bulk silicon layer or in overlying layers or structures. The conductive plugs typically have a thermal conductivity of at least about 150 W/m° C., and more typically at least about 200 W/m° C.

Referring to FIGS. 1 to 5, a specific example of the present invention is described. Specifically referring to FIG. 1, a first structure 10 is formed. The first structure 10 is a metal containing structure. Initially, a bulk silicon substrate or wafer 12 is provided. A metal layer 14 is deposited over the bulk silicon substrate 12. In this embodiment, platinum is sputtered over the bulk silicon substrate 12 to a thickness of about 400 Å. Alternatively, one or more of chromium, molybdenum, tantalum, titanium, and tungsten can be used in place of or in addition to platinum. An insulation layer 16 containing silicon dioxide is then formed over the metal layer 14 by CVD techniques. Either low pressure chemical vapor deposition (LPCVD) or plasma enhanced chemical vapor deposition (PECVD) may be employed. In this embodiment, the insulation layer 16 is formed by PECVD using either silane and oxygen or silane and nitrous oxide. The insulation layer 16 has a thickness of about 1,500 Å.

Figure 2:
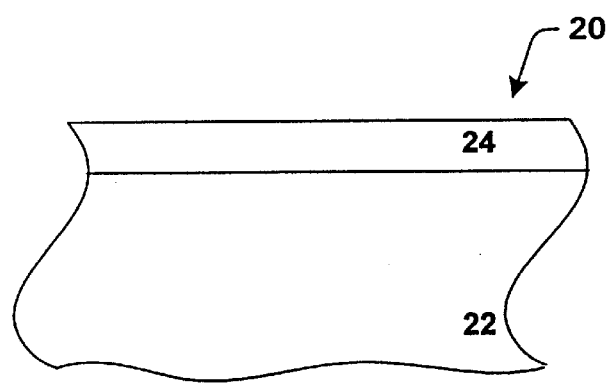
FIG. 2 is cross-sectional view of a second structure used to make an SOI substrate according to one embodiment of the present invention.

Referring to FIG. 2, a second structure 20 is provided. The second structure 20 contains a bulk silicon layer 22 and an insulation layer 24 thereover. In this embodiment, the insulation layer 24 contains silicon dioxide. Also in this embodiment, the thickness of the insulation layer 24 is about 1,500 Å.

Figure 3:
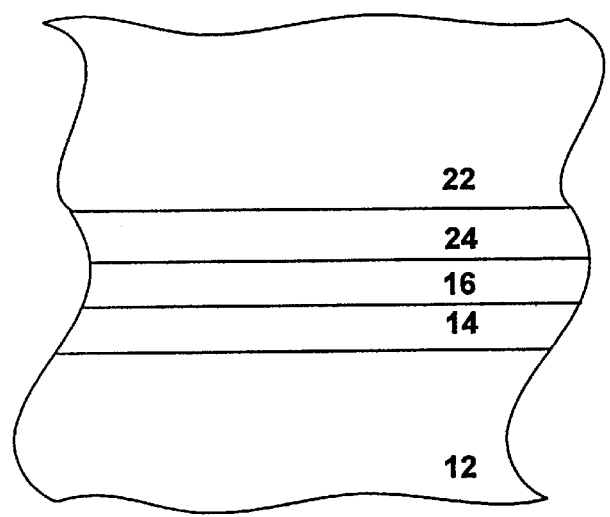
FIG. 3 is cross-sectional view of a bonded structure used to make an SOI substrate according to one embodiment of the present invention.

Referring to FIG. 3, the first structure 10 is bonded to the second structure 20 at the respective insulation layers 16 and 24. The respective insulation layers 16 and 24 are fused by application of heat for a sufficient period of time to bond the first and second structures 10 and 20. For example, the first and second structures 10 and 20 are held together for about 2 hours under a temperature of about 1,100° C.

Figure 4:
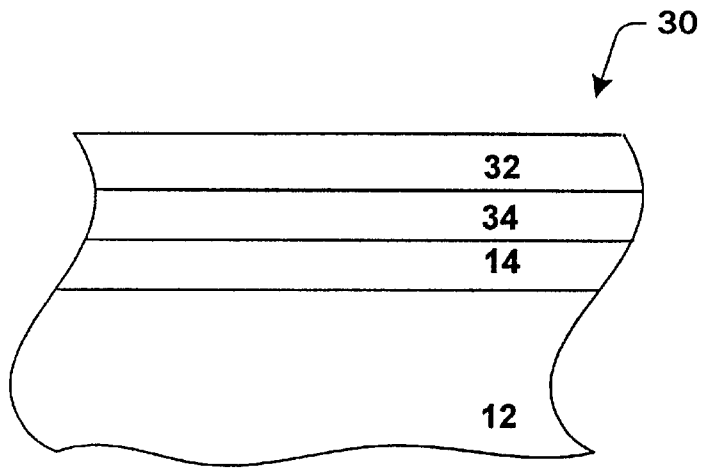
FIG. 4 is cross-sectional view of an SOI substrate according to one embodiment of the present invention.

Referring to FIG. 4, the bulk silicon layer 22 of in FIG. 3 of the second structure 20 is etched to a desired thickness to provide an SOI substrate 30 and specifically a device layer 32. The SOI substrate 30 contains bulk silicon layer 12, metal layer 14, buried insulation layer 34, and device layer 32. The thickness of the device layer 32 is about 1,500 Å. The thickness of the insulation layer 34 (formerly the insulation layers 16 and 24) is about 3,000 Å. The metal layer 14 remains about the same as initially deposited, but during the processing, the platinum metal converts to platinum silicide. The metal layer 14 has a thickness that is about 13% of the thickness of the insulation layer 34.

The SOI substrate 30 has good heat removal properties due to the presence of the metal layer 14 containing platinum silicide. In particular, the high thermal conductivity of platinum silicide (relative to silicon dioxide) removes heat that may locally accumulate in certain areas (typically near or under devices and/or conductive structures) of the device layer and insulation layer. The high thermal conductivity of platinum silicide also dissipates heat that may locally accumulate in certain areas of the device layer and insulation layer (or distributes the heat throughout the platinum silicide layer).

Figure 5:
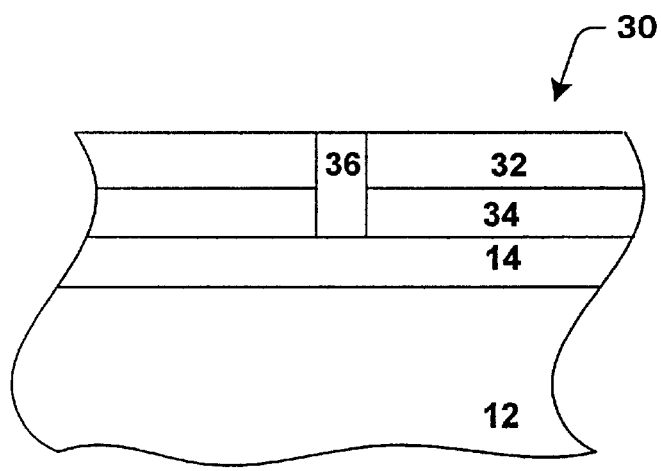
FIG. 5 is cross-sectional view of an SOI substrate according to another embodiment of the present invention.

Referring to FIG. 5, additional heat removal may be removed from SOI substrate 30 by optionally forming a conductive plug 36 in the buried insulation layer 34 and device layer 32 to thermally contact the metal layer 14. Conductive plug 36 contains an optional barrier layer and a conductive material. Use of an optional barrier layer (not shown) depends upon the identity of the conductive material of the conductive plug 36. The barrier layer, if employed serves as a diffusion barrier layer preventing conductive material of the conductive plug 36 from diffusing into the buried insulation layer 34. The barrier layer may be made of any suitable conductive material or materials. Examples of suitable conductive materials for the barrier layer include titanium nitride, tungsten, tantalum, tungsten-titanium alloys such as an alloy containing about 90% tungsten and about 10% titanium, tantalum silicon nitride, tungsten nitride, and combinations thereof. The barrier layer may be formed using any suitable technique to a thickness sufficient to serve as a diffusion barrier for conductive plug 36. For example, the thickness of the barrier layer may be in the range from about 100 Å to about 1,500 Å.

Conductive plug 36 is then formed over the substrate (by initially etching a contact hole using suitable lithography and etching techniques). The conductive plug 36 may be made of any suitable conductive material or materials. Examples of suitable conductive materials include one or more of copper, tungsten, gold, silver, aluminum, any alloys thereof. In this embodiment, the conductive material is tungsten. The barrier layer and the conductive plug 36 may be deposited using CVD or PVD techniques. The conductive plug removes heat from the metal based layer 14 and transfers it up through the structure to other layers or structures (not shown).

Referring to FIGS. 1 to 4 and 6, another specific example of the present invention is described. Specifically referring to FIG. 1, a first structure 10 is formed. The first structure 10 is a metal containing structure. Initially, a bulk silicon substrate or wafer 12 is provided. A metal layer 14 is deposited over the bulk silicon substrate 12. In this embodiment, titanium is sputtered over the bulk silicon substrate 12 to a thickness of about 1,100 Å. Alternatively, one or more of chromium, molybdenum, tantalum, platinum, and tungsten can be used in place of or in addition to titanium. An insulation layer 16 containing silicon dioxide is then formed over the metal layer 14 by CVD techniques. Either low pressure chemical vapor deposition (LPCVD) or plasma enhanced chemical vapor deposition (PECVD) may be employed. In this embodiment, the insulation layer 16 is formed by PECVD using either silane and oxygen or silane and nitrous oxide. The insulation layer 16 has a thickness of about 1,000 Å.

Referring to FIG. 2, a second structure 20 is provided. The second structure 20 contains a bulk silicon layer 22 and an insulation layer 24 thereover. In this embodiment, the insulation layer 24 contains silicon dioxide. Also in this embodiment, the thickness of the insulation layer 24 is about 1,000 Å.

Referring to FIG. 3, the first structure 10 is bonded to the second structure 20 at the respective insulation layers 16 and 24. The respective insulation layers 16 and 24 are fused by application of heat for a sufficient period of time to bond the first and second structures 10 and 20. For example, the first and second structures 10 and 20 are held together for about 3 hours under a temperature of about 1,050° C.

Referring to FIG. 4, the bulk silicon layer 22 of in FIG. 3 of the second structure 20 is etched to a desired thickness to provide an SOI substrate 30 and specifically a device layer 32. The SOI substrate 30 contains bulk silicon layer 12, metal layer 14, buried insulation layer 34, and device layer 32. The thickness of the device layer 32 is about 2,000 Å. The thickness of the insulation layer 34 (formerly insulation layers 16 and 24) is about 2,000 Å. The metal layer 14 remains about the same as initially deposited, but during the processing, the titanium metal converts to titanium silicide. The metal layer 14 has a thickness that is about 55% of the thickness of the insulation layer 34.

The SOI substrate 30 has good heat removal properties due to the presence of the metal layer 14 containing titanium silicide. In particular, the high thermal conductivity of titanium silicide (relative to silicon dioxide) removes heat that may locally accumulate in certain areas (typically near or under devices and/or conductive structures) of the device layer and insulation layer. The high thermal conductivity of titanium silicide also dissipates heat that may locally accumulate in certain areas of the device layer and insulation layer (or distributes the heat throughout the titanium silicide layer).

Figure 6:
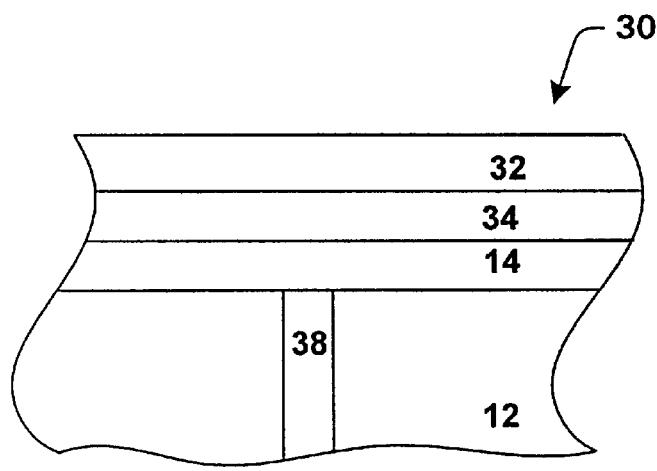
FIG. 6 is cross-sectional view of an SOI substrate according to yet another embodiment of the present invention.

Referring to FIG. 6, additional heat removal may be removed from SOI substrate 30 by optionally forming a conductive plug 38 in the bulk silicon substrate 12 to thermally contact the metal layer 14. Conductive plug 38 contains an optional barrier layer and a conductive material. Use of an optional barrier layer (not shown) depends upon the identity of the conductive material of the conductive plug 38. The barrier layer, if employed serves as a diffusion barrier layer preventing conductive material of the conductive plug 38 from diffusing into the bulk silicon substrate 12. The barrier layer may be made of any suitable conductive material or materials. Examples of suitable conductive materials for the barrier layer include titanium nitride, tungsten, tantalum, tungsten-titanium alloys, tantalum silicon nitride, tungsten nitride, niobium and molybdenum and combinations thereof. The barrier layer may be formed using any suitable technique to a thickness sufficient to serve as a diffusion barrier for conductive plug 38. For example, the thickness of the barrier layer may be in the range from about 100 Å to about 1500 Å.

Conductive plug 38 is then formed in the substrate (by initially etching a contact hole using suitable lithography and etching techniques). The conductive plug 38 may be made of any suitable conductive material or materials. Examples of suitable conductive materials include one or more of copper, tungsten, gold, silver, aluminum, any alloys thereof. In this embodiment, the conductive material is tungsten. The barrier layer and the conductive plug 38 may be deposited using CVD or PVD techniques. The conductive plug removes heat from the metal based layer 14 and transfers it down through the structure into the bulk silicon layer 12 where the heat may easily dissipate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a silicon-on-insulator substrate, comprising:

providing a silicon substrate;

depositing a metal based layer over the silicon substrate;

forming a first insulation layer over the metal based layer to provide a first structure;

providing a second structure comprising a silicon device layer and a second insulation layer;

bonding the first structure and the second structure together so that the first insulation layer is adjacent the second insulation layer; and removing a portion of the silicon device layer thereby providing the silicon-on-insulator substrate having a combined insulation layer having a thickness of about 100 Å to about 5,000 Å, wherein the metal based layer has a thickness that is one of less than 15% of the thickness of the combined insulation layer and greater than 50% of the thickness of the combined insulation layer.

2. The method of claim 1, wherein the metal based layer comprises at least one of chromium, molybdenum, platinum, tantalum, titanium, and tungsten.

3. The method of claim 1, wherein the metal based layer comprises at least one of chromium silicide, molybdenum silicide, platinum silicide, tantalum silicide, titanium silicide, and tungsten silicide.

4. A method of forming a silicon-on-insulator substrate, comprising:

providing a first silicon substrate;

depositing a metal based layer over the first silicon substrate;

forming a first insulation layer over the metal based layer to provide a first structure;

providing a second structure comprising a second silicon layer and a second insulation layer;

bonding the first structure and the second structure together so that the first insulation layer is adjacent the second insulation layer; and removing a portion of the second silicon layer thereby providing the silicon-on-insulator substrate having a combined insulation layer having a thickness of about 100 Å to about 5,000 Å.

wherein the metal based layer has a thickness that is one of less than 15% of the thickness of the combined insulation layer and greater than 50% of the thickness of the combined insulation layer, and wherein the metal based layer has a thickness from about 150 Å to about 500 Å.

5. A method of forming a silicon-on-insulator substrate, comprising:

providing a first silicon substrate;

depositing a metal based layer over the first silicon substrate;

forming a first insulation layer over the metal based layer to provide a first structure;

providing a second structure comprising a second silicon layer and a second insulation layer;

bonding the first structure and the second structure together so that the first insulation layer is adjacent the second insulation layer; and removing a portion of the second silicon layer thereby providing the silicon-on-insulator substrate having a combined insulation layer having a thickness of about 100 Å to about 5,000 Å.

wherein the metal based layer has a thickness that is one of less than 15% of the thickness of the combined insulation layer and greater than 50% of the thickness of the combined insulation layer, and wherein the metal based layer has a thickness from about 1,500 Å to about 3,500 Å.

6. A method of forming a silicon-on-insulator substrate, comprising:

providing a first silicon substrate;

depositing a metal based layer over the first silicon substrate;

forming a first insulation layer over the metal based layer to provide a first structure;

providing a second structure comprising a second silicon layer and a second insulation layer;

bonding the first structure and the second structure together so that the first insulation layer is adjacent the second insulation layer; and removing a portion of the second silicon layer thereby providing the silicon-on-insulator substrate having a combined insulation layer having a thickness of about 100 Å to about 5,000 Å, wherein the metal based layer has a thickness that is one of less than 15% of the thickness of the combined insulation layer and greater than 50% of the thickness of the combined insulation layer, and wherein at least one of the first insulation layer and the second insulation layer comprise silicon dioxide.

7. The method of claim 1, wherein the silicon-on-insulator substrate comprises the silicon substrate; the metal based layer; a buried insulation layer comprising the first insulation layer and the second insulation layer; and a device layer comprising silicon.

8. A method of facilitating heat removal from a device layer of a silicon-on-insulator substrate comprising bulk silicon, an insulation layer over the bulk silicon, and a silicon device layer over the insulation layer, comprising:

forming a metal based layer having a thickness from about 100 Å to about 4,000 Å between the bulk silicon and the insulation layer; and forming a conductive plug through at least one of the insulation layer and the silicon device layer contacting the metal based layer, and the bulk silicon contacting the metal based layer.

9. The method of claim 8, wherein the metal based layer is formed by one of physical vapor deposition and chemical vapor deposition.

10. The method of claim 8, wherein the metal based layer comprises at least one of chromium silicide, molybdenum silicide, platinum silicide, tantalum silicide, titanium silicide, and tungsten silicide.

11. The method of claim 8, wherein the metal based layer has a thickness from about 100 Å to about 1,000 Å.

12. The method of claim 8, wherein the metal based layer has a thickness from about 1,200 Å to about 4,000 Å.

13. The method of claim 8, further comprising forming a conductive plug through the silicon device layer and the insulation layer so as to contact the metal based layer.

14. A silicon-on-insulator substrate, comprising:

a silicon substrate layer;

a metal based layer comprising a metal silicide over the silicon substrate layer;

an insulation layer over the metal based layer;

a silicon device layer comprising silicon over the insulation layer; and at least one of at least one conductive plug through the insulation layer and the silicon device layer contacting the metal based layer, and at least one conductive plug through the silicon substrate layer contacting the metal based layer.

15. The method of claim 1, wherein the metal based layer facilitates the transfer of heat.

16. The method of claim 1, wherein the metal based layer prevents the build up of heat in the silicon device layer.

* * * * *